US005781379A

United States Patent [19]
Erpelding et al.

[11] Patent Number: 5,781,379
[45] Date of Patent: Jul. 14, 1998

[54] SINGLE BEAM FLEXURE FOR A HEAD GIMBAL ASSEMBLY

[75] Inventors: A. David Erpelding; Oscar J. Ruiz; Darrell D. Palmer; Surya Pattanaik, all of San Jose, Calif.

[73] Assignee: International Business Machines Corporation, Armonk, N.Y.

[21] Appl. No.: 816,976

[22] Filed: Mar. 13, 1997

Related U.S. Application Data

[63] Continuation of Ser. No. 648,312, May 13, 1996, abandoned, which is a continuation of Ser. No. 353,175, Dec. 8, 1994, abandoned, which is a continuation-in-part of Ser. No. 270,928, Jul. 5, 1994, abandoned, which is a continuation-in-part of Ser. No. 213,913, Mar. 15, 1994, abandoned.

[51] Int. Cl.$^6$ ............................................. G11B 5/48
[52] U.S. Cl. ............................................. 360/104
[58] Field of Search ........................... 360/103, 104

[56] References Cited

U.S. PATENT DOCUMENTS

| H1424 | 4/1995 | Budde | 360/104 |
|---|---|---|---|
| 4,167,765 | 9/1979 | Watrous | 360/103 |

(List continued on next page.)

FOREIGN PATENT DOCUMENTS

| 0568257A1 | 11/1993 | European Pat. Off. | |
|---|---|---|---|
| 0 599 669 A2 | 6/1994 | European Pat. Off. | |
| 53-19015 | 2/1978 | Japan | 360/103 |
| 53-30310 | 3/1978 | Japan | |
| 60-246015 | 12/1985 | Japan | 360/103 |
| 1-248372 | 3/1989 | Japan | |
| 1-189083 | 7/1989 | Japan | |
| 2-218078 | 8/1990 | Japan | |
| 3-91173 | 4/1991 | Japan | |
| 4219618 | 8/1992 | Japan | 360/103 |
| 5282642 | 10/1993 | Japan | 360/103 |
| 2193833 | 2/1988 | United Kingdom | |
| WO94/16438 | 7/1994 | WIPO | |

OTHER PUBLICATIONS

IBM TDB vol. 22 No. 4 Sep. 1979, "Combination Suspension–Lead Cable For a Multi-Gap Read/Write Head", J.R. Reidenbach pp. 1602–1603.

Anonymous disclosure, "Circuitized Suspension Flexure–Foliage for Disk Drives," Published in Research Disclosure, No. 339, Kenneth Mason Publications Ltd, England (Jul. 1992).

Cooper et al., "Constrained Layer Damper Spring Assemblies," IBM Technical Disclosure Bulletin, vol. 33, No. 8, pp. 373–374 (Jan. 1991).

Ohwe et al., "Development of Integrated Suspension System for a Nanoslider with an MR Head Transducer," two–page preprint (not dated).

Rogers Corporation, "FLEX–I–MID® Adhesiveless Laminate," Product Data Sheet (not dated).

(List continued on next page.)

*Primary Examiner*—Stuart S. Levy
*Assistant Examiner*—William J. Klimowicz
*Attorney, Agent, or Firm*—Hopkins & Carley; Donald J. Pagel

[57] ABSTRACT

A flexure for use in a head gimbal assembly comprising a single narrow torsion beam that connects a suspension load beam to a slider support member. The flexure is centered underneath a read/write slider and may be comprised of a laminated material having a conductor layer, a dielectric layer and a support layer. A plurality of electrical leads may be formed in the conductor layer for attachment the slider. The slider is mechanically attached to the slider support member by a first set of solder balls the height of which create a space for accommodating deflections of the flexure and allowing the electrical leads to pass underneath the slider. Electrical connections to the slider are made using a plurality of right angle fillet joints between the slider and a second set of solder balls on the slider support member. The shape of the torsion beam may be varied to yield different levels of stiffness to pitch, roll and yaw movement of the flexure.

25 Claims, 9 Drawing Sheets

U.S. PATENT DOCUMENTS

| | | | |
|---|---|---|---|
| 4,543,295 | 9/1985 | St. Clair et al. | 428/458 |
| 4,594,221 | 6/1986 | Caron et al. | 420/485 |
| 4,639,289 | 1/1987 | Lazzari | 156/643 |
| 4,732,733 | 3/1988 | Sakamoto et al. | 420/485 |
| 4,760,478 | 7/1988 | Pal et al. | 360/104 |
| 4,761,699 | 8/1988 | Ainslie et al. | 360/103 |
| 4,789,914 | 12/1988 | Ainslie et al. | 360/103 |
| 4,819,094 | 4/1989 | Oberg | 360/104 |
| 4,839,232 | 6/1989 | Morita et al. | 428/473.5 |
| 4,906,803 | 3/1990 | Albrechtra et al. | 174/254 |
| 4,937,133 | 6/1990 | Watanabe et al. | 428/209 |
| 4,991,045 | 2/1991 | Oberg | 360/104 |
| 4,996,623 | 2/1991 | Erpelding et al. | 360/104 |
| 5,145,553 | 9/1992 | Albrechta et al. | 156/640 |
| 5,198,945 | 3/1993 | Blaeser et al. | 360/104 |
| 5,298,331 | 3/1994 | Kanakarajan et al. | 428/458 |
| 5,334,346 | 8/1994 | Kim et al. | 420/485 |
| 5,353,181 | 10/1994 | Frater et al. | 360/104 |
| 5,424,030 | 6/1995 | Takahashi | 4420/473 |
| 5,427,848 | 6/1995 | Baer et al. | 428/332 |

OTHER PUBLICATIONS

Mitsui Toatsu Chemicals, Inc. "KOOL BASE®, " Product Data Sheet, pp. 1–7 (not dated).

DuPont, "Kapton® EKJ Self–Adhering Polyimide Composite Films," Product Data Sheet (not dated).

E.M. Kerwin, "Damping of Flexural Waves by a Constrained Viscoelastic Layer," The Journal of the Acoustical Society of America, vol. 31, pp. 952–962 (1959).

C.E. Yeack–Scranton, "$PVF_2$ " Resonance Damping For Magnetic Recording, IBM Technical Disclosure Bulletin, vol. 26, No. 6, pp. 2922–2923 (Nov. 1983).

J.H. Nayak, "Auxiliary Mass Damping of Disk–File Sliders," IBM Technical Disclosure Bulletin, vol. 26, No. 6, pp. 2922–2923 (Nov. 1983).

R. Plunkett and C.T. Lee, "Length Optimization for Constrained Viscoelastic Layer Damping, " The Journal of the Acoustical Society of America, vol. 48, pp. 150–161 (1970).

F. Maseeh and S. Senturia, "Viscoelasticity and Creep Recovery of Polyimide Thin Films," VLSI Memo 90–600, MIT (Jun. 1990).

SINGLE BEAM FLEXURE FOR A HEAD GIMBAL ASSEMBLY

This application is a continuation of Ser. No. 08/648,312, filed May 13, 1996, now abandoned, which is a continuation of Ser. No. 08/353,175, filed Dec. 8, 1994, now abandoned, which is a continuation-in-part of Ser. No. 08/270,928, filed Jul. 5, 1994, now abandoned, which is a continuation-in-part of Ser. No. 08/213,913, filed Mar. 15, 1994, now abandoned.

TECHNICAL FIELD

The present invention relates to a flexure for use in the head gimbal assembly of a data recording disk file and more particularly to a flexure having a single beam which is centered underneath the slider.

BACKGROUND ART

Magnetic recording disk files that utilize a transducer mounted on a slider for reading and/or writing data on at least one rotatable disk are well-known in the art. In such systems, the slider is typically attached to an actuator arm by a suspension system.

The use of solder balls for attaching the slider to a slider support means is known in the art. For example, Ainslie et al., in U.S. Pat. No. 4,761,699, disclose the use of reflowed solder balls for making both the mechanical attachment of the slider to the suspension and the electrical connection of the transducer to the disk file read/write electronics.

The use of laminated materials for constructing slider suspension systems is also known in the art. For example, Erpelding et al., in U.S. Pat. No. 4,996,623, disclose a suspension system comprised of a sheet of polyimide material sandwiched between two metal layers. This patent also discloses that a plurality of conductors can be formed in the copper layer of the suspension for providing electrical connections to the slider.

Many suspension systems (also called head gimbal assemblies) include a flexure that is positioned in some manner between the slider and the suspension. For example, R. Watrous, in U.S. Pat. No. 4,167,765, discloses a flexure that is added onto a stiffened member. Blaeser et. al, in U.S. Pat. No. 5,198,945, disclose another design that utilizes the material of the suspension as the flexure.

A problem with both of these approaches is that it is difficult to make electrical connections between the magnetic transducer and signal conductors on the suspension without adversely affecting the pitch and roll stiffness of the head gimbal assembly.

Still another design utilizes a round protuberance (called a load dimple) positioned at the end of the load beam for applying a preload to the slider. Load dimples do not adversely affect pitch and roll rotations of the slider. However, the load dimple technique is very difficult, or impossible, to adapt to very small slider size systems.

Furthermore, there are manufacturing problems associated with load dimple systems such as controlling the dimple height and location and preventing dimple cracking.

SUMMARY OF THE PRESENT INVENTION

Briefly, the preferred embodiment of the present invention is a single beam laminated flexure which is positioned between the load beam and the slider support member in the head gimbal assembly. The flexure is aligned with the center of the slider so as to facilitate uniform pitching and rolling about the center of the slider.

The shape of the flexure is chosen so as to minimize the stiffness of the flexure while still retaining sufficient strength to accommodate the load of the slider. The flexure is a single beam having a width which is less than the width of the load beam. The edges of the flexure are flared where it attaches to the load beam and to the slider support member. The width of the flexure may be constant or tapered. By varying design parameters such as the width, thickness and curvature of the taper, the effect of the flexure shape on deflection parameters such as pitch, roll and yaw may be varied.

In the preferred embodiment, the flexure is comprised of a laminated material which includes a conductor layer, a dielectric layer and a support layer. The conductor layer is comprised of a high strength electrically conductive material such as a high strength copper alloy. The dielectric layer is comprised of an electrically insulating material such as a polyimide, Teflon® or epoxy. The support layer is comprised of a rigid material such as stainless steel, titanium or beryllium copper.

In the preferred embodiment, the electrical leads for the slider are formed directly in the conductive layer of the flexure. This simplifies the manufacturing process and minimizes the effect of the electrical leads on pitch and roll stiffness. The electrical leads are then connected to a magnetic transducer on the slider using one or more right angle fillet joints.

A space is created between the flexure and the bottom of the slider by seating the slider on a plurality of solder balls positioned on the slider support member. The space provides a region for deflection of the flexure and allows the electrical leads to run underneath the slider.

Additionally, the use of high strength materials in the conductive layer widens the range of design possibilities for the flexure. For example, the strength attributable to the conductive layer allows the thickness of the support layer to be reduced. In some embodiments, the support layer can be eliminated and the flexure is comprised entirely of the conductor layer and the dielectric layer.

DETAILED DESCRIPTION OF THE PREFERRED EMBODIMENT

Figure 1:
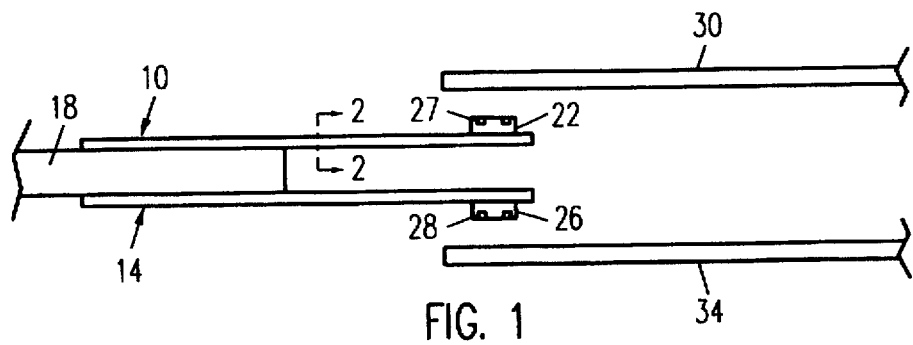
FIG. 1 is a schematic side view of a slider suspension system according to the present invention.

FIG. 1 is a schematic diagram of a first transducer suspension 10 and a second transducer suspension 14 attached to an actuator arm 18. The suspensions 10 and 14 are also referred to as head gimbal assemblies.

A first slider 22 is positioned at an end of the first transducer suspension 10 distally to the arm 18. A second slider 26 is positioned at an end of the second transducer suspension 14 distally to the arm 18. The slider 22 includes one or more data transducers 27 for reading and/or writing data on a magnetic medium such as a hard magnetic disk 30. Similarly, the slider 26 includes one or more data transducers 28 for reading and/or writing data on a magnetic medium such as a hard magnetic disk 34.

Figure 2:
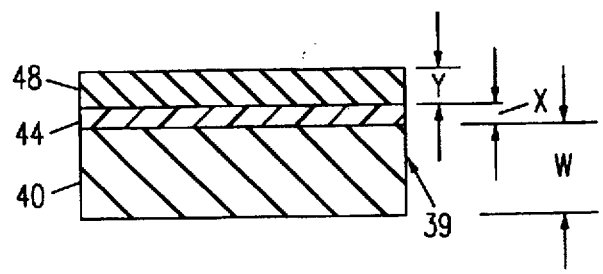
FIG. 2 is a cross-sectional view of the slider suspension system taken along the line 2—2 of FIG. 1.

FIG. 2 is a cross-sectional view of the first transducer suspension 10 illustrating that the suspension 10 is a multilayered laminate 39 comprised of a first layer 40, a second layer 44 and a third layer 48. The first layer 40 is positioned adjacent to one surface of the second layer 44. The third layer 48 is positioned adjacent to a different surface of the second layer 44 so that the second layer 44 separates the first layer 40 and the third layer 48, with the layers 40, 44 and 48 all lying in planes that are parallel to each other. The layers 40, 44 and 48 are generally secured together by a thin adhesive layer applied between layers 40 and 44 and between layers 44 and 48.

Representative dimensions and compositions for the various elements illustrated in FIG. 2 are as follows: In the preferred embodiment, the first layer 40 has a thickness "w" of approximately 0.051 millimeters and comprises full hard 301, 302 or 304 stainless steel. In more general terms, the first layer 40 has a thickness "w" of approximately 0.076 millimeters, or less, and comprises a rigid material such as stainless steel. Typically, the first layer 40 comprises 300 series stainless steel, but other stainless steels and other rigid materials could also be used (e.g. beryllium copper or titanium).

In the preferred embodiment, the second layer 44 comprises a polyimide that has properties similar to the properties of Kapton® E brand polyimide manufactured by E. I. Du Pont de Nemours and Company ("Dupont"), including a dielectric constant in the range of approximately 3.0 to 3.5. Additionally, the coefficient of thermal expansion (CTE) of the polyimide should be such that the laminate 39 will be in a neutral stress condition after the laminate 39 is manufactured. A neutral stress condition means that the laminate 39 will remain flat after manufacturing and will not curl up after either the first layer 40 or the third layer 48 are etched. Furthermore, the adhesive used to secure the layers 40, 44 and 48 together should be sufficiently robust to keep the laminate 39 intact up to a temperature of approximately 350° C.

In the preferred embodiment, the second layer 44 has a thickness "x" of approximately 0.0165 millimeters. This thickness is chosen because a thin layer 44 is needed to keep the stiffness of the suspension 10 low, but the price of polyimide films thinner than 0.0165 millimeters is a limiting consideration.

Rogers Corporation (Circuit Materials Unit), of Chandler, Ariz., supplies a laminate 39 having a second layer 44 that meets the specifications listed above. In ordering the laminate 39, the desired material for the third layer 48, such as one of the alloys described below, is provided to Rogers Corporation along with the specifications for the first layer 40, the second layer 44 and the third layer 48. Rogers Corporation then prepares a suitable laminate using proprietary methods.

In the Rogers laminate, the second layer 44 comprises a 0.0165 millimeter polyimide layer (layer 44) which is thought to be the same polyimide (or a similar polyimide) as is used in the Kool Base® brand material manufactured by Mitsui Toatsu Chemicals, Inc. In the Kool Base polyimide, a thin layer of adhesive is applied to each side of the polyimide layer for bonding the layer 44 to the layers 40 and 48.

A substitute for the Rogers laminate is a laminate custom manufactured by Dupont having a 0.0165 millimeter layer of Dupont's EKJ self-adhering polyimide composite (Kapton® E brand polyimide manufactured by Dupont) and meeting the other specifications listed above for the second layer 44.

Stated more generally, the second layer 44 has a thickness "x" of approximately 0.018 millimeters or less, and comprises a dielectric material such as a polyimide having a dielectric constant in the range of approximately 3.0 to 3.5 and a coefficient of thermal expansion (CTE) which allows the laminate 39 to be in a neutral stress condition after the laminate 39 is manufactured.

Polyimides of the types described in U.S. Pat. Nos. 4,839,232, 4,543,295 and 5,298,331 are potentially useful as the second layer 44, although the suitability of a specific polyimide for a particular purpose should be verified. Additionally, Teflon® compounds of the formula $F(CF_2)_nF$ are also suitable for use in the second layer 44, as are nonconductive epoxies and other dielectric materials.

In the preferred embodiment, the third layer 48 has a thickness "y" of approximately 0.0178 millimeters and comprises a copper-nickel-silicon-magnesium alloy such as the copper alloy C7025 with a TMO3 temper (full hard heat temper) manufactured by Olin Brass (composition 96.2% Cu; 3% Ni; 0.65% Si; and 0.15% Mg).

Examples of other specific materials that can function as the third layer 48 include the following: 1. a high strength beryllium copper alloy (composition: 97.2 –98.4% Cu; 0.2–0.6% Be; and 1.4–2.2% Ni, such as Brush Wellman beryllium copper alloy 3 (C17510) with an HT temper); 2. a high strength brass alloy (composition: 97.5% Cu; 2.35% Fe; 0.03% P; and 0.12% Zn, such as Olin Brass copper alloy C194 with an ex. spring temper); 3. a high strength titanium copper alloy (composition: 96.1–96.6% Cu; and 2.9–3.4% Ti, such as Nippon Mining titanium copper alloy with a TiCuR1-EHM temper).

Stated more generally, the third layer 48 comprises a high strength electrically conducting material and has a thickness "y" of approximately 0.018 millimeters or less. For purposes of the present invention, the term "high strength" refers to a material with a tensile yield strength ($S_y$) greater than 70 ksi (kilopounds per square inch) and which doesn't soften by more than 10% when exposed to a temperature of 300° C. for one hour.

Figure 3:
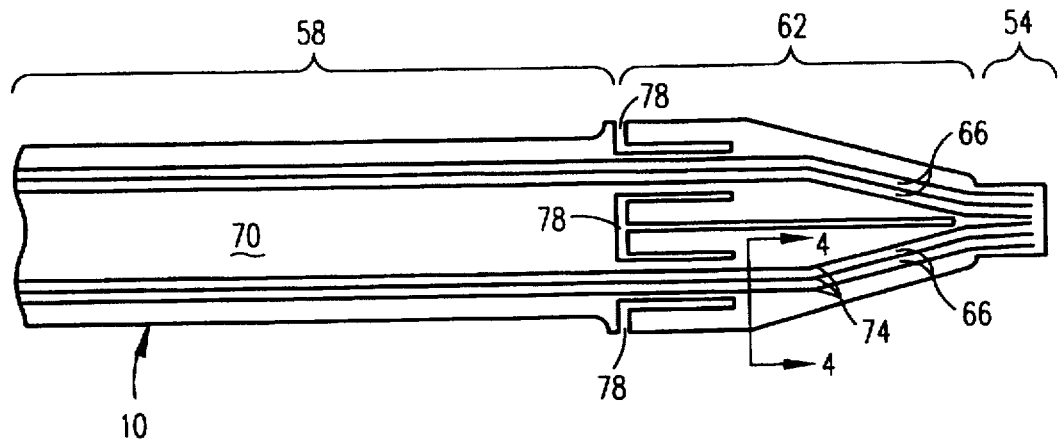
FIG. 3 is a top view of a slider suspension system according to the present invention.

FIG. 3 is a top view of the first transducer suspension 10. The suspension 10 has a slider portion 54, an arm portion 58 and a link portion 62 (also referred to as a load beam). A plurality of electrical lines 66 are present on a surface 70 of the system 10. Each electrical line 66 has a space 74 positioned along each of its sides so as to prevent the electrical line 66 from shorting out with an adjacent electrical line 66.

A plurality of hinges 78 are also shown in the surface 70. The hinges 78 are regions in which the third layer 48 has been removed to form channels in the third layer 48. The hinges 78 increase the flexibility of the suspension 10 and/or permit the suspension 10 to be bent at some predetermined angle. Similarly, hinges can also be formed by etching channels in the first layer 40.

Figure 4:
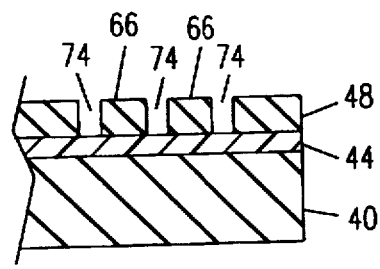
FIG. 4 is a cross-sectional view of the slider suspension system taken along the line 4—4 of FIG. 3.

The portions 54, 58 and 62 designate regions of the suspension 10, but the suspension 10 is preferably formed from one continuous piece of laminated material as is explained herein with respect to FIGS. 2 and 4.

The slider portion 54 is the part of the suspension 10 on which the read/write slider 22 is mounted. The electrical lines 66 form the electrical connections for connecting the slider 22 and the transducer 27 to an external system as is explained later with respect to FIG. 5.

The arm portion 58 is the part of the suspension 10 that is connected to the actuator arm 18. Typically, the arm portion 58 is attached to the actuator arm 18 by bonding, welding, swaging or screwing the arm portion 18 to the actuator arm along the first layer 40 shown in FIG. 2.

The link portion 62 connects the arm portion 58 to the slider portion 54. The suspension 14 is identical to the suspension 10 and includes all of the elements shown in FIG. 3, including the portions 54, 58 and 62 and the electrical lines 66.

FIG. 4 is a cross-sectional view of the suspension 10 illustrating that the electrical lines 66 are regions of the third layer 48 that are roughly rectangular in cross section, and that are separated from each adjacent electrical line 66 by one of the spaces 74. The spaces 74 extend down to the second layer 44 so that the second layer 44 is exposed through the space 74.

The electrical lines 66 are formed by etching the surface 70 using standard metal etching techniques. For example, when the third layer 48 comprises one of the copper alloys described above, the layer 48 is etched with ferric chloride or other suitable etchants. The etching process removes metal from specified regions, thereby forming the spaces 74 that define the electrical lines 66. In practice, a typical chemical etching process will not form a groove having the perfect rectangular shape illustrated in FIG. 4 for the spaces 74. Actual grooves formed by a chemical etching process are slightly rounded or tapered as is well-known in the art. In general, features such as the electrical lines 66, the spaces 74 and the hinges 78 are formed directly on the third layer 48 using photolithographic processes or by using numerically controlled imaging such as laser machining.

In the preferred embodiment, the first, second and third layers 40, 44 and 48 initially comprise a continuous sheet of laminated material of copper alloy/polyimide/stainless steel laminate. A plurality of slider suspension systems 10 are then manufactured from the sheet of laminate using the techniques described above.

A general procedure for the preparation of the metal-polyimide laminated material is described by St. Clair et al. in U.S. Pat. No. 4,543,295 (issued Sep. 24, 1985).

Figure 5:
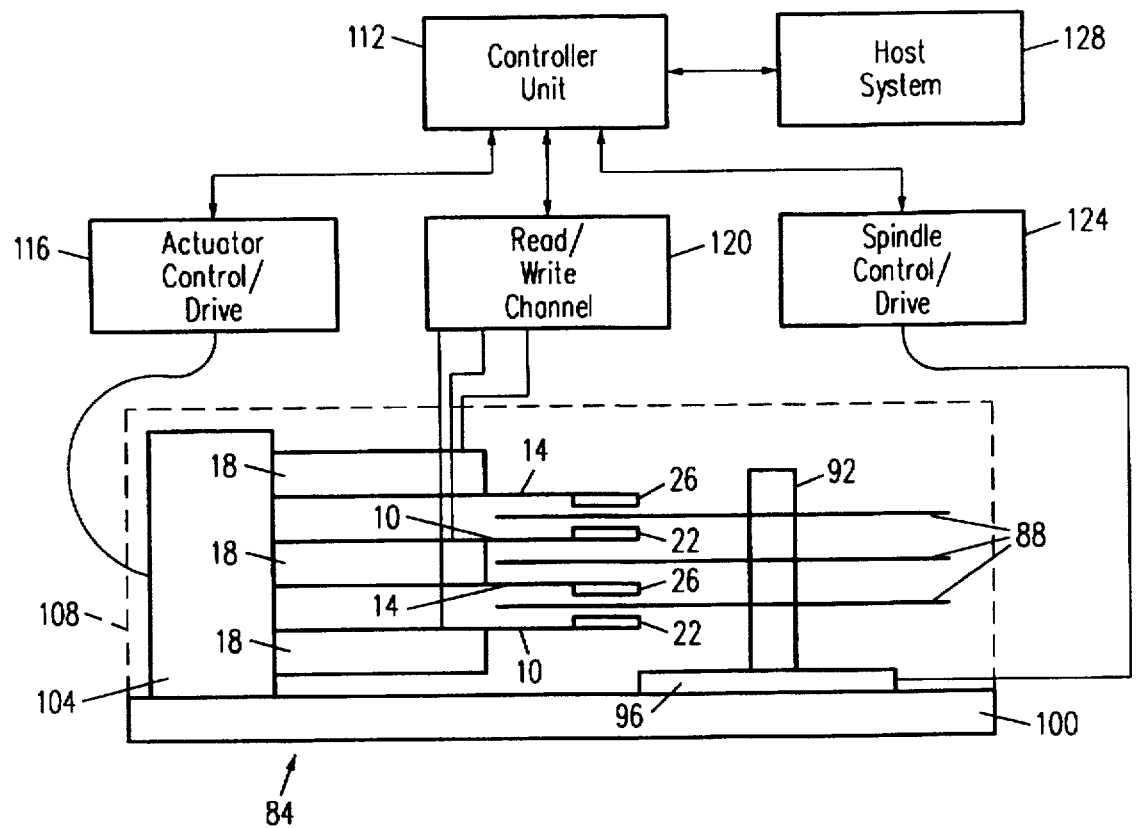
FIG. 5 is a schematic diagram of a disk file that utilizes the slider suspension system according to the present invention.

FIG. 5 is a schematic diagram of a magnetic recording disk file 84 that utilizes the transducer suspension system 10 of the present invention. It should be appreciated that the suspension system 14 is identical to the suspension system 10 so that the following comments apply equally to either the suspension system 10 or the suspension system 14. It should also be appreciated that the suspension systems 10 and 14 could be used with other data storage systems, such as floppy disk drives, optical drives or compact disk players.

The disk file 84 comprises a plurality of magnetic recording disks 88 suitable for use in hard disk drives. The disks 88 are mounted on a spindle shaft 92 which is connected to a spindle motor 96. Motor 96 is mounted to a chassis 100.

The plurality of read/write sliders 22 and 26 are positioned over the disks 88 such that each disk 88 can be accessed by one of the sliders 22 or 26. Each of the sliders 22 and 26 includes a transducer for reading and writing data on a plurality of concentric data tracks on the disks 88 and are attached to one of the suspension systems 10 (or 14). Each of the suspension systems 10 (or 14) are attached to the actuator arm 18 which is attached to a rotary actuator 104. The rotary actuator 104 moves the actuator arm 18 (and hence the suspension system 10 or 14 and the sliders 22 or 26) in a radial direction across the disk 88. An enclosure 108 (shown by a dashed line in FIG. 5) seals the disk file 84 and provides protection from particulate contamination.

A controller unit 112 provides overall control to the system 84. The controller unit 112 contains a central processing unit (CPU), memory unit and other digital circuitry and is connected to an actuator control/drive unit 116 which in turn is electrically connected to the actuator 104. This allows the controller 112 to control the movement of the sliders 22 and 26 over the disks 88. The controller 112 is electrically connected to a read/write channel 120 which in turn is electrically connected to the sliders 22 and 26. This allows the controller 112 to send and receive data from the disks 88. The controller 112 is electrically connected to a spindle control/drive unit 124 which in turn is electrically connected to the spindle motor 96. This allows the controller 112 to control the rotation of the disks 88. A host system 128, which is typically a computer system, is electrically connected to the controller unit 112. The host system 128 may send digital data to the controller 112 to be stored on the disks 88, or may request that digital data be read from the disks 88 and sent to the system 128. The basic operation and structure of data storage systems, such as the disk file 84 (without the suspension systems 10 or 14), is well-known in the art and is described in more detail in *Magnetic Recording Handbook*, C. Dennis Mee and Eric D. Daniel, McGraw—Hill Book Company (1990).

Figure 6:
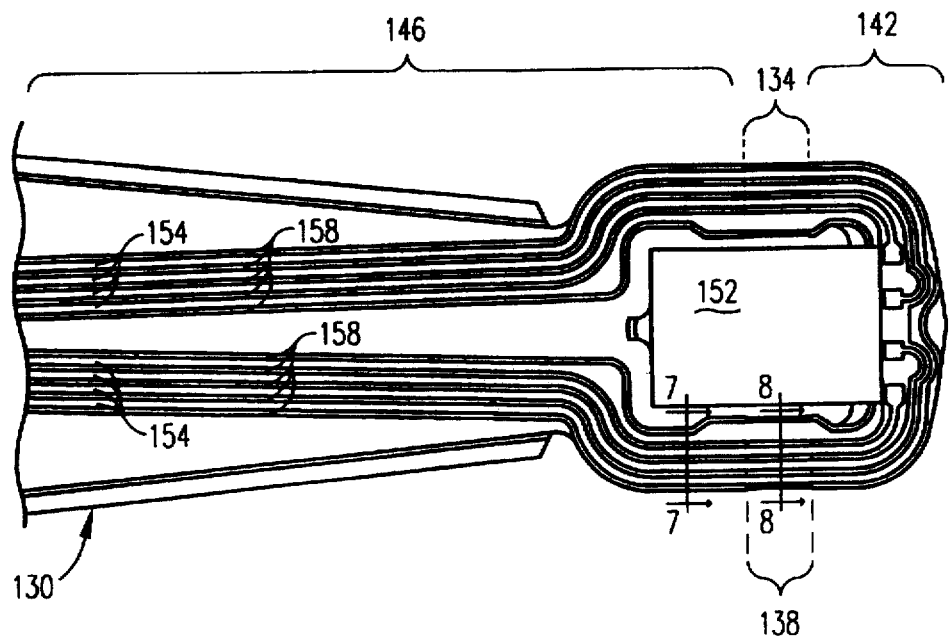
FIG. 6 is a top view of a slider suspension system having a pair of flexures in the head support area according to the present invention.

FIG. 6 is a top view of a transducer suspension 130 having a flexure 134 and a flexure 138. The construction and use of the suspension 130 is analogous to the construction and use of the suspension 10 shown in FIG. 3, and the transducer suspension 130 can be substituted for the suspensions 10 or 14 in the disk file 84 shown in FIG. 5.

Specifically, the suspension 130 has a slider portion 142 analogous to the slider portion 54, a link portion 146 (also referred to as a load beam) analogous to the link portion 62 and an arm portion (not shown) analogous to the arm portion 58. The suspension 130 also includes a slider 152 (which includes one or more data transducers for reading and/or writing data on a magnetic medium) analogous to the slider 22, a plurality of electrical lines 154 analogous to the electrical lines 66 and a plurality of spaces 158 analogous to the spaces 74.

The flexures 134 and 138 are regions of reduced stiffness (compared to the link portion 146) that separate the slider portion 142 from the link portion (load beam) 146 and which function to allow the slider 152 to conform to, and fly over, the recording disk 88.

Figure 7:
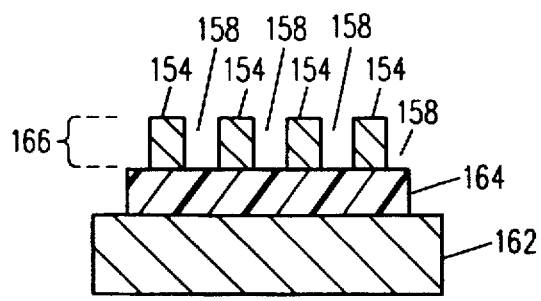
FIG. 7 is a cross-sectional view of the slider suspension system taken along the line 7—7 of FIG. 6.

FIG. 7 is a cross-sectional view of the transducer suspension 130 illustrating that the suspension 130 is a multilayered structure comprised of a first layer 162 analogous to the first layer 40, a second layer 164 analogous to the second layer 44 and a third layer 166 analogous to the third layer 48. The dimensions, compositions and orientations of the layers 162, 164 and 166 are identical to those previously described for the layers 40, 44 and 48 with respect to FIG. 2. In the suspension 130, the layers 162, 164 and 166 are oriented so that the third layer 166 is positioned closest to the disk 88 over which the slider 152 is flying. The laminate 39 shown in FIG. 2 is also oriented this way.

FIG. 7 also illustrates that the electrical lines 154 are regions of the third layer 166 that are roughly rectangular in cross section, and that are separated from each adjacent electrical line 154 by one of the spaces 158. The spaces 158 extend down to the second layer 164 so that the second layer 164 is exposed through the space 158. One of the spaces 158 is positioned along each side of an electrical line 154 so as to prevent the electrical line 154 from shorting out with an adjacent electrical line 154. The electrical lines 154 are formed in the same manner as was previously described for the electrical lines 66.

Figure 8:
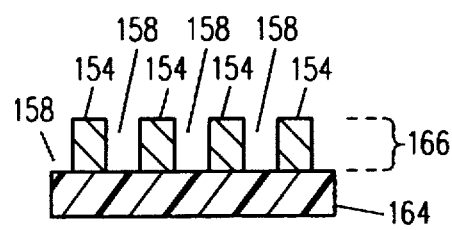
FIG. 8 is a cross-sectional view of the slider suspension system taken along the line 8—8 of FIG. 6.

FIG. 8 is a cross-sectional view illustrating that the flexure 138 comprises a region of the suspension 130 that separates the slider portion 142 from the link portion (load beam) 146 and in which the first layer 162 has been completely removed from underneath the second layer 164 leaving only the layers 164 and 166 to connect the slider portion 142 to the link portion 146. Alternatively, the flexure 138 can comprise a region in which the first layer 162 is only partially removed from underneath the second layer 164. The construction of the flexure 134 is identical to that of the flexure 138.

The total or partial removal of the first layer 162 from underneath the second layer 164 decreases the stiffness of the flexures 134 and 138. The use of a high strength alloy for the third layer 166 gives the flexures 134 and 138 sufficient strength to support the slider portion 142 and the slider 152 (even with the first layer 162 completely or partially removed) while still having the flexibility (low stiffness) required to allow the slider 152 to conform to, and fly over, the recording disk 88.

Referring now to FIGS. 1 and 2, the utility of the laminated structure 39 can be explained. The trend within the hard disk drive industry towards smaller drives has created a demand for very small (and low cost) head gimbal assemblies. The laminated structure of the transducer suspension 10 permits very small head gimbal assemblies to be designed especially when the third layer 48 is comprised of a high strength electrical conductor.

The three layers of the suspension 10 function as follows: The first layer 40 (or 162) is a stiffener layer that gives rigidity to the system 10. The second layer 44 (or 164) is comprised of a dielectric material that functions as an electrical insulator between the first layer 40 (or 162) and the third layer 48 (or 166). For some applications, it is useful if the second layer 44 (or 164) is a dielectric material that also has viscoelastic properties (like a polyimide) which increases damping. Viscoelastic means that the stress in a deformed material is proportional to both the deformation and the rate of deformation. Viscoelastic materials also exhibit creep and relaxation behavior. Creep means that under constant stress the deformation increases in time. Relaxation means that under constant fixed deformation the stress decreases steadily in time.

The third layer 48 (or 166) is comprised of a high strength electrically conducting material, such as one of the high strength copper alloys described previously. The third layer 48 (or 166) is preferably comprised of a high conductivity alloy (e.g. a copper alloy) because the electrical lines 66 (or 154) need to function as efficient electrical conductors.

The use of high strength alloys in the third layer 48 (or 166) is important for several reasons: First, the use of a high strength alloy in the conductor layer reduces the stiffness of the suspension 10 (or 130) which is important when the slider 22 (or 152) is small (See Example 2 below).

Second, the use of a high strength alloy permits the thickness of the third layer 48 (or 166) to be kept less than or equal to eighteen microns (as shown in Example 1 below, thickness varies inversely with the square root of yield strength).

Third, the use of a high strength alloy permits more design options such as the integration of the electrical lines 66 (or 154) and the hinges 78 directly into the third layer 48 (or 166). Similarly, the use of a high strength alloy permits the use of the flexures 134 and 138, because the third layer 166 carries most of the load once the first layer 162 has been removed.

Fourth, the high strength copper alloy adds robustness to the suspension and reduces yield losses due to handling damage during the manufacturing process.

Example 1

The reason use of a high strength alloy reduces the thickness of the third layer 48 (or 166) is illustrated by the following discussion:

The thickness "t" of a rectangular metal strip having a width "w" and a length "L" is related to the yield strength of the material "$S_y$" by equation 1:

$$t = C/\sqrt{S_y} \tag{1}$$

where C=constant=$(6PL/w)^{1/2}$ and P is the load applied to the metal strip to cause it to bend.

The following calculation uses Equation 1 to illustrate that if the metal strip must carry the same load (P) and is comprised of a second material having a yield strength which is three times greater than the yield strength of a first material, then the metal strip comprised of the second material can be 42% thinner and still have the same strength: If $S_{y1}$=soft copper yield strength=30 ksi; and $S_{y2}$=high strength copper alloy yield strength=90 ksi; then $t_2/t_1 = (S_{y1}/S_{y2})^{1/2} = 0.58$ (a 42% reduction in thickness).

EXAMPLE 2

The reason use of a high strength alloy reduces the stiffness of the third layer 48 (or 166) is illustrated by the following discussion:

The stiffness "k" of a rectangular metal strip having a width "w" and length "L" is related to the thickness "t" of the material by equation 2:

$$k = Dt^3 \qquad (2)$$

where D=constant=$Ew/6L^3$ and E is Young's modulus.

The following calculation uses Equation 2 and the result of Example 1 to illustrate that if the metal strip must carry the same load (P) and is comprised of a second material having a yield strength which is three times greater than a first material, then the metal strip comprised of the second material has an 81% reduction in stiffness: If $Sy_{y1}$=soft copper yield strength=30 ksi; and $S_{y2}$=high strength copper alloy yield strength=90 ksi; then $k_2/k_1 = (t_2/t_1)^3 = (0.58)^3 = 0.19$ (an 81% reduction in stiffness).

Figure 9:
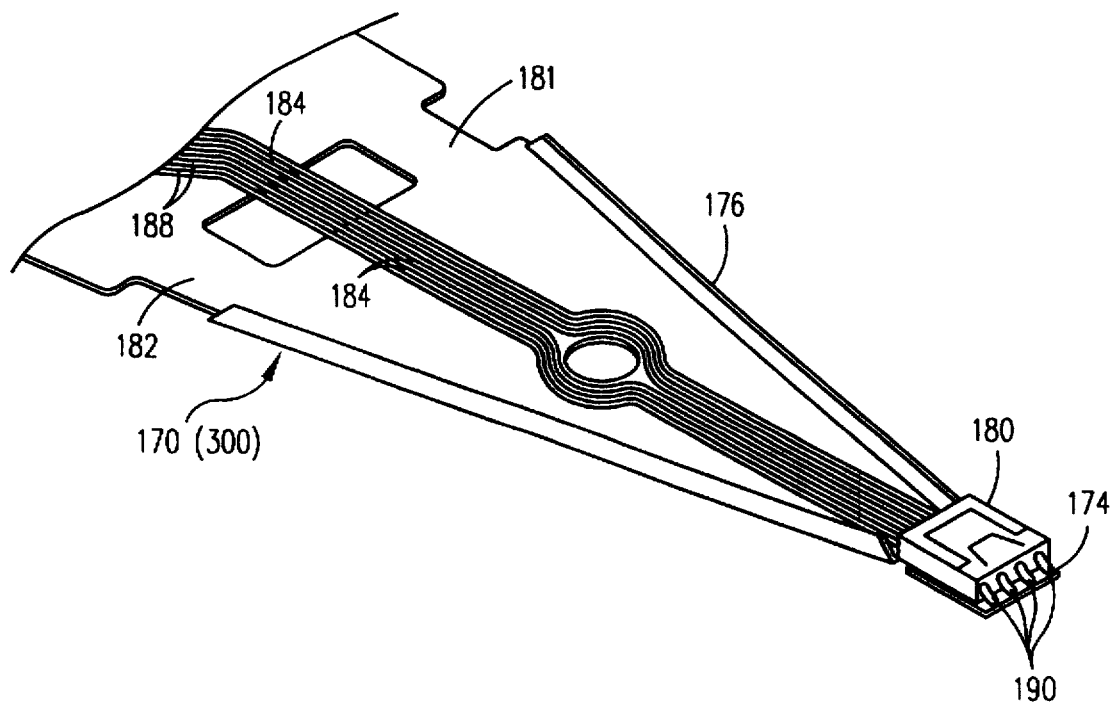
FIG. 9 is a top view of a slider suspension system showing a plurality of right angle fillet joints for forming the electrical connections to the slider according to the present invention.

FIG. 9 is a top view of a transducer suspension 170. The construction and use of the suspension 170 is analogous to the construction and use of the suspensions 10 and 130, and the transducer suspension 170 can be substituted for the suspensions 10 or 14 in the disk file 84 shown in FIG. 5.

Specifically, the suspension 170 has a slider portion 174 analogous to the slider portion 54, a link portion 176 (also referred to as a load beam) analogous to the link portion 62 and an arm portion (not shown) analogous to the arm portion 58. The suspension 170 also includes a slider 180 analogous to the slider 22, a hinge area 181, a hinge area 182, a plurality of electrical lines 184 analogous to the electrical lines 66 and a plurality of spaces 188 analogous to the spaces 74. The hinge areas 181 and 182 are used to set the load of the link portion 176.

The slider 180 also includes one or more data transducers 228 (shown in FIG. 10) for reading and/or writing data on a magnetic medium. In the preferred embodiment, the slider 180 has dimensions of 1 mm×1.25 mm×0.3 mm. However, the present invention is not limited to this slider size. The transducer 228 is electrically connected to the electrical lines 184 by a plurality of electrical connectors 190. The connectors 190 are referred to as right angle fillet joints and are formed in the manner described by Ainslie et al. in U.S. Pat. No. 4,761,699.

Figure 10:
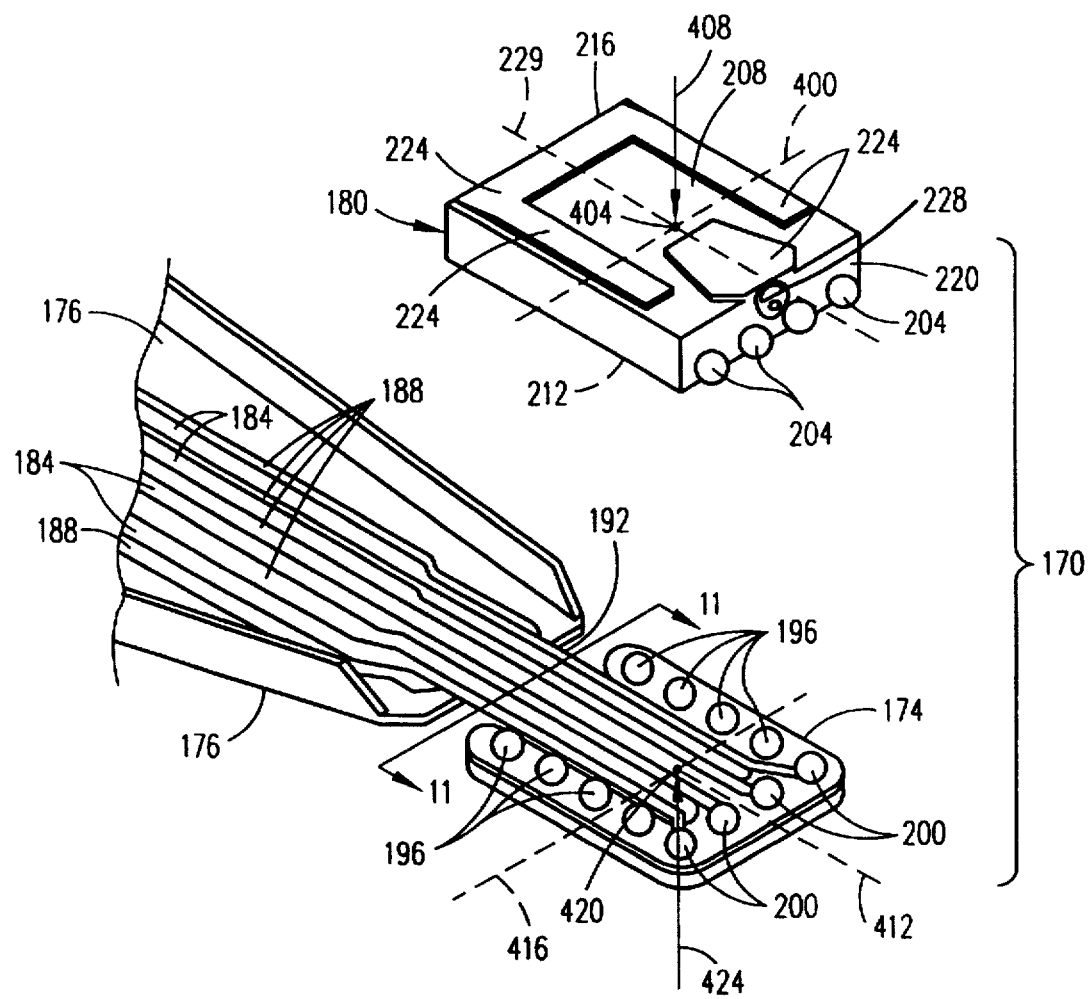
FIG. 10 is an exploded view of a slider suspension system showing the solder balls used for attaching the slider to the suspension system according to the present invention.

FIG. 10 is an exploded view of part of the transducer suspension 170 showing that the suspension 170 also includes a flexure 192. The flexure 192 is a region of reduced stiffness (compared to the link portion 176) that connects the slider portion 174 to the link portion (load beam) 176. The reduced stiffness of the flexure 192 allows the slider 180 to conform to, and fly over, a magnetic medium such as the recording disk 88 shown in FIG. 5.

FIG. 10 also illustrates that the slider 180 is seated on a plurality of solder balls 196. The solder balls 196 serve two purposes: First, the solder balls 196 provide a means for mechanically attaching the slider 180 to the slider portion 174 in the manner described by Ainslie et al. in U.S. Pat. No. 4,761,699. Second, the height of the solder balls 196 provides a clearance between the flexure 192 and the slider 180 (see dimension "e" in FIG. 11). The clearance is needed because the flexure 192 undergoes deflection or deformation caused by forces such as the load of forcing the slider 180 toward the disk 88, or due to vibrations that occur while the slider 180 flies over the disk 88.

It should be appreciated that materials other than solder could be used for the solder balls 196. Any fusible material that provides bonding would be acceptable, such as epoxy and thermal plastic adhesive, as would various welds, such as ultrasonic welds, resistance welds and laser welds. Additionally, other types of spacers such as the shim 384 shown in FIG. 24 could be used to create the required clearance.

A second set of solder balls 200 is positioned along an edge of the slider portion 174. The solder balls 200 are positioned for fusing to a plurality of solder balls 204 located on the slider 180. When fused together, the solder balls 200 and 204 form the electrical connectors 190 (right angle fillet joints shown in FIG. 9).

The slider 180 is a conventional magnetoresistive (MR) slider or an inductive slider having an air bearing surface 208, a back side 212 which lies in a plane oriented parallel to the plane containing the air bearing surface 208, a leading edge 216 and a trailing edge 220. A plurality of rails 224 are positioned on the air bearing surface 208 and a conventional thin film read/write transducer 228 is formed on the trailing edge 220. The transducer 228 could also be formed in other locations, such as on the air bearing surface 208 as is described by J. Lazzari in U.S. Pat. No. 4,639,289.

For reference purposes, a dashed line (longitudinal center line) 229 is shown in FIG. 10 which denotes the geometric center of the slider 180 in the longitudinal direction. In the preferred embodiment, the longitudinal center line 229 bisects the slider 180 into two approximately symmetrical halves so that the weight of the slider 180 is balanced about the line 229.

A dashed line (perpendicular axis) 400 denotes the geometric center of the slider 180 in the lateral direction. In the preferred embodiment, the perpendicular axis 400 bisects the slider 180 into two approximately symmetrical halves so that the weight of the slider 180 is balanced about the axis 400. A point 404 is defined as the intersection of the center line 229 and the perpendicular axis 400. A force 408 acts downward on the slider 180.

Similarly, a dashed line (longitudinal center line) 412 denotes the geometric center of the slider portion 174 in the longitudinal direction. In the preferred embodiment, the line 412 bisects the slider portion 174 into two approximately symmetrical halves so that the weight of the slider portion 174 is balanced about the line 412.

A dashed line (perpendicular axis) 416 divides the slider portion 174 in the lateral direction into two parts. A point 420 is defined as the intersection of the line 412 and the axis 416. A force 424 acts on the slider portion 174.

Figure 11:
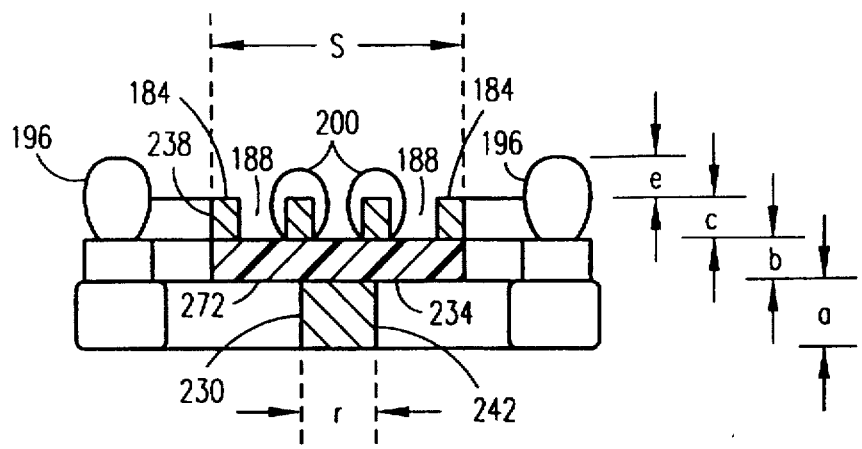
FIG. 11 is a cross-sectional view of the slider suspension system taken along the line 11—11 of FIG. 10.

The suspension 170 is comprised of a three-layer laminate analogous to the laminated structure shown in FIG. 2. FIG. 11 is a cross-sectional view of the suspension 170 taken through the flexure 192 which illustrates that the suspension 170 and the flexure 192 are comprised of a first layer 230 analogous to the first layer 40, a second layer 234 analogous to the second layer 44 and a third layer 238 analogous to the third layer 48. The first layer 230 has a thickness "a;" the second layer 234 has a thickness "b;" and the third layer 238 has a thickness "c." The thicknesses "a," "b" and "c," and the compositions and orientations of the layers 230, 234 and 238 are identical to those previously described for the layers 40, 44 and 48 with respect to FIG. 2. A dimension "e" represents the clearance provided by the solder balls 196 between the top surface of the flexure 192 and the bottom surface of the slider 180. Typically, "e" is approximately equal to 0.075 mm.

FIG. 11 also illustrates that the electrical lines 184 are regions of the third layer 238 that are roughly rectangular in cross section, and that are separated from each adjacent electrical line 184 by one of the spaces 188. The spaces 188 extend down to the second layer 234 so that the second layer 234 is exposed through the space 188. One of the spaces 188 is positioned between each adjacent electrical line 184 so as to prevent the electrical line 184 from shorting out the adjacent electrical line 184. The electrical lines 184 are formed in the same manner as was previously described for the electrical lines 66.

FIG. 11 illustrates that in the flexure 192, the first layer 230 has a width "r" which is narrower than the width "s" of the third layer 238. The part of the first layer 230 having the width "r" is the torsion beam 242 shown in FIG. 12, and the part of the third layer 238 having the width "s" includes the electrical lines 184 in the region 286 shown in FIG. 14. In the preferred embodiment, "r" is approximately equal to 0.15 mm and "s" is approximately equal to 0.35 mm.

Figure 12:
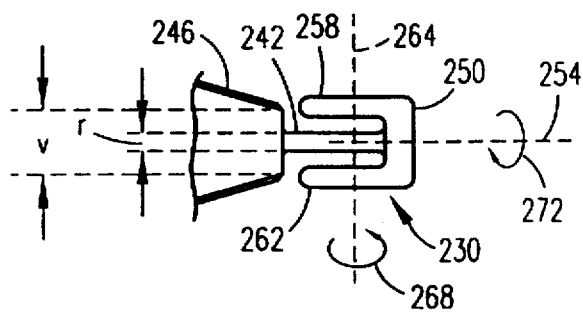
FIG. 12 is a top view of the support layer of the slider suspension system shown in FIG. 9.

The fact that the width "r" of the torsion beam 242 is narrower than the width "s" of the electrical lines 184 decreases the stiffness of the flexure 192 and provides both pitch and roll flexibility (see FIG. 12). Further reduction in pitch and roll stiffness is possible by routing the electrical lines 184 away from the torsion beam 242, as is shown by the "serpentine" configuration for the electrical lines 384 and 398 illustrated in FIGS. 22 and 25. The serpentine routing increases the length of the electrical lines 184 (or 384 or 398) which exponentially reduces their contribution to stiffness of the flexure 192.

Also, when the electrical lines 184 and the central section 274 are removed from the torsion beam 242, the effective thickness of the flexure 192 is reduced. A reduction in the thickness of the flexure 192 reduces its stiffness by a cubic relationship.

FIG. 12 illustrates the shape of the first layer 230 when the second and third layers 234 and 238 are removed from the suspension 170. A torsion beam 242 connects a link portion 246 to a U-shaped slider portion 250. The link portion 246 forms one layer of the link portion 176 shown in FIGS. 9 and 10, and the slider portion 250 forms one layer of the slider portion 174 shown in FIGS. 9 and 10.

The torsion beam 242 comprises a rectangular shaped beam symmetrically positioned about a longitudinal center line 254 that bisects the torsion beam 242 in the longitudinal direction. The ends of the rectangular shaped beam are flared slightly where the torsion beam 242 merges with the link portion 246 and the slider portion 250. The slider portion 250 is comprised of a pair of support fingers 258 and 262 which are joined on one end disposed symmetrically disposed on either side of the torsion beam 242. When the slider 180 is mounted on the slider portion 174 (or on the slider portion 250), the longitudinal center line 254 is aligned with the line 229 which bisects the slider 180. The torsion beam 242 has the width "r" which is also shown in FIG. 11. The width "r" of the torsion beam 242 is always less than a width "v" which is the width of the link portion 246 where the torsion beam 242 joins the link portion 246.

The alignment of the torsion beam 242 and the symmetrical disposition of the fingers 258 and 262 are used so that the slider 180 will be balanced on the slider portion 250 with the torsion beam 242 being symmetrically aligned underneath the center of the slider 180 in the longitudinal direction. This positioning of the torsion beam 242 allows for uniform pitching and rolling action about the center of the slider 180. Pitch is defined as rotation of the slider 180 about an axis 264 that is perpendicular to the center line 254 as is indicated by a curved arrow 268. Roll is defined as rotation about the center line 254 as indicated by a curved arrow 272. Generally, the center line 254 is coincident with the center line 412 shown in FIG. 10.

Figure 13:
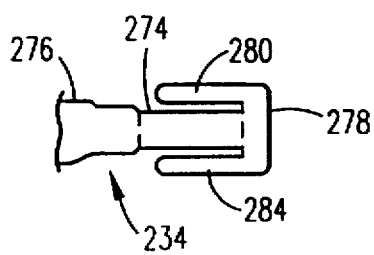
FIG. 13 is a top view of the dielectric layer of the slider suspension system shown in FIG. 9.

FIG. 13 illustrates the shape of the second layer 234 when the first and third layers 230 and 238 are removed from the suspension 170. The second layer 234 includes a rectangular shaped central section 274 which lays over the torsion beam 242; a link section 276 which lays over the link section 246; and U-shaped slider portion 278 which lays over the slider portion 250. The slider portion 278 includes a pair of support fingers 280 and 284 which lay over the support fingers 258 and 262, respectively.

Figure 14:
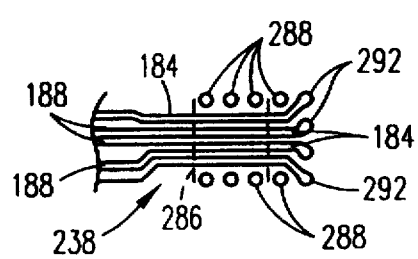
FIG. 14 is a top view of the conductor layer of the slider suspension system shown in FIG. 9.

FIG. 14 illustrates the shape of the third layer 238 when the first and second layers 230 and 234 are removed from the suspension 170. The electrical lines 184 are positioned so that they lay on top of the second layer 234. The electrical lines 184 in a central region 286 span the central section 274 (shown in FIG. 13) when the layers 230, 234 and 238 are assembled. A plurality of pads 288 are circular areas of the third layer 238 upon which the solder balls 196 are positioned. Similarly, a plurality of pads 292 are circular areas of the third layer 238 upon which the solder balls 200 are positioned.

Figure 15:
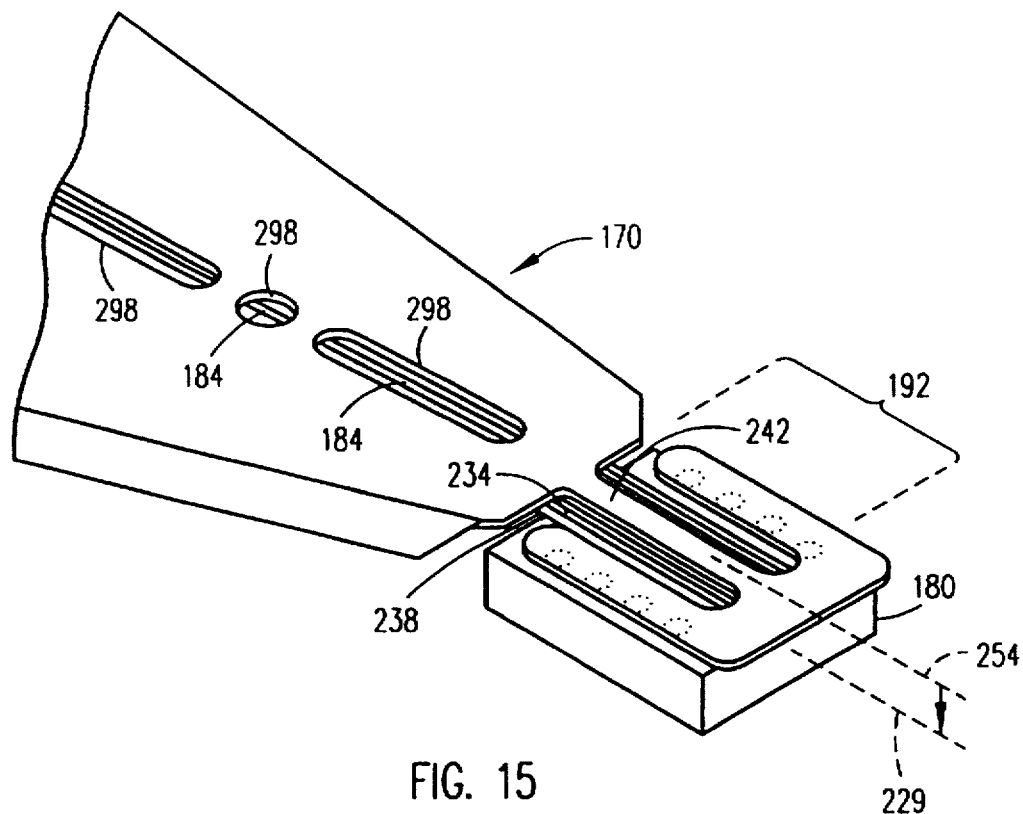
FIG. 15 is a back view of the slider suspension system shown in FIG. 9.

FIG. 15 is a back view of the suspension 170 showing how the slider 180 is positioned relative to the flexure 192. The flexure 192 includes the torsion beam 242 and the portions of the second layer 234 and the third layer 238 that span the torsion beam 242. In the preferred embodiment, the center of the torsion beam 242 is aligned to the center of the slider 180 so that the longitudinal center line 254 projects onto the dashed line 229 which denotes the longitudinal center line of the slider 180. This allows for uniform rolling action about the center of the slider 180.

Referring to FIG. 10, uniform pitching action is similarly achieved by aligning the perpendicular axis 416 of the slider portion 174, to the perpendicular axis 400 of the slider 180.

Furthermore, because the width "r" (shown in FIG. 11) is smaller than the width "s," the effective stiffness of the torsion beam 242 is less than if the width "r" was as wide as the width "s." Stated another way, the effect of the third layer 238 on pitch and roll stiffness is reduced by having the outermost electrical lines 184 positioned so that they do not lay directly over the width "r" of the torsion beam 242.

FIG. 15 also illustrates that a plurality of slots 298 are positioned in the first layer 230 in regions of the link portion 246. The slots 298 are positioned underneath the electrical lines 184 and are holes that extend completely through the first layer 230. The slots 298 function to reduce the capacitance of the electrical lines 184, thereby improving the performance of the transducer 228.

Referring to FIG. 10, a more detailed explanation of the positioning of the slider 180 with respect to the flexure 192 is as follows: The force 424 is generated by the the spring force of the hinge areas 181 and 182 which is transmitted to the slider portion 174 by the load beam 176. The spring force deflects the torsion beam 242 upward, together with the central section 274 and the electrical lines 184 that span the central section 274. The force 424 will only act through the point 420 if the components of the slider portion 174, such as the central section 270 and the electrical lines 184, are symmetrically positioned with respect to the center line 412 and the axis 416. If this symmetry does not exist then the force 424 will be located at a new location that does not coincide with the point 420. The new location is determinable using analytical techniques or empirical methods, and has a constant relationship to the longitudinal center line 412 and the perpendicular axis 416.

The force 408 is produced by the aerodynamics of the air bearing surface 208 and acts to push the slider 180 downward towards the slider portion 174. The force 408 will act through the point 404 only if the rails 224 are symmetrically positioned about the center line 229 and the axis 400. If this symmetry does not exist, the point through which the force 408 does act can be calculated using numerical models that predict air bearing surface performance. The location of the resulting force 408 has a constant relationship to the rails 224.

Optimum alignment of the slider 180 to the torsion beam 242 is achieved when the force 408 is aligned to the force 424. This is accomplished by aligning the rails 224 to the torsion beam 242 such that the predetermined relationship of these features causes the forces 408 and 424 to act along a common line. This alignment minimizes the tendancy of the slider 180 to pitch about the axis 400 or roll about the center line 229.

Figure 16:
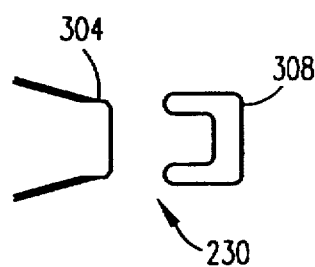
FIG. 16 is a top view of the support layer of an alternative embodiment of a slider suspension system.
Figure 17:
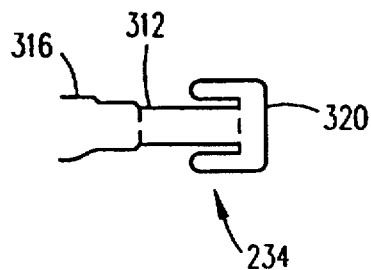
FIG. 17 is a top view of the dielectric layer which is positioned on top of the support layer shown in FIG. 16.
Figure 18:
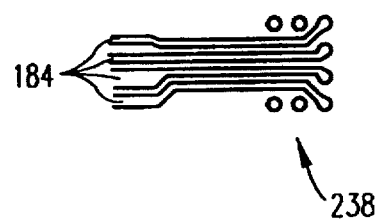
FIG. 18 is a top view of the conductor layer which is positioned on top of the dielectric layer shown in FIG. 17.

FIGS. 16–18 illustrate a configuration for a suspension 300 which is analogous to the suspension 170 shown in FIG. 9. FIG. 16 illustrates that in the suspension 300, the torsion beam 242 has been completely eliminated in order to further reduce pitch and roll stiffness. In this configuration, the first layer 230 comprises a link portion 304 and a U-shaped slider portion 308. The link portion 304 is not attached to the slider portion 308 by any part of the first layer 230. Instead, the connection between the link portion 176 and the slider portion 174 (both shown in FIG. 9) is provided by the second layer 234 and the third layer 238 as illustrated in FIGS. 17 and 18.

FIG. 17 illustrates the shape of the second layer 234 when the first and third layers 230 and 238 are removed from the suspension 300. The second layer 234 includes a rectangular shaped central section 312; a link portion 316 which lays over the link portion 304; and U-shaped slider portion 320 which lays over the slider portion 308.

FIG. 18 illustrates the shape of the third layer 238 when the first and second layers 230 and 234 are removed from the suspension 300. The electrical lines 184 are positioned so that they lay on top of the second layer 234 and span the central section 312 (shown in FIG. 17) when the layers 230, 234 and 238 are assembled.

The use of a high strength alloy for the third layer 238 allows for flexure designs such as that shown in FIGS. 16–18 to be possible. This flexure design, where the first layer 230 is removed from the flexure 192, is only possible if the requirements of the air bearing surface 208, such as preload and stiffness, are properly matched to the mechanical performance that can be achieved with a flexure 192 with the first layer 230 removed. An additional benefit of using a high strength alloy for the third layer 238, which is present in all of the flexure designs, is robustness and resistance to damage that can occur during the suspension and/or disk file manufacturing processes.

Figure 19:
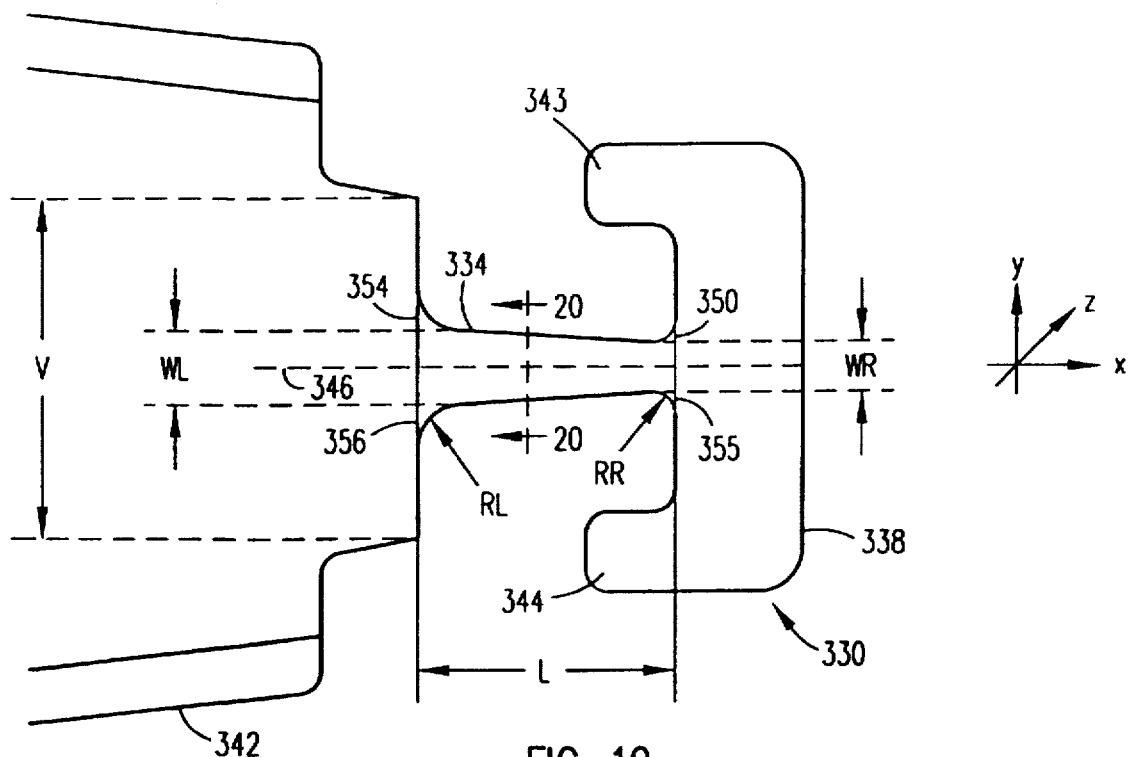
FIG. 19 is a top view of the support layer of a slider suspension system illustrating the shape of the torsion beam.

FIG. 19 is a top view of a first layer 330 that illustrates various parameters associated with a torsion beam 334 which may be varied to influence the pitch, roll, yaw, vertical deflection and stress of the torsion beam 334. The first layer 330 is analogous to the first layer 230 shown in FIG. 12 and may be substituted for the first layer 230 in the suspension 170. The first layer 330 comprises a slider portion 338 analogous to the slider portion 250, a link portion 342 (also referred to as a load beam) analogous to the link portion 246 and an arm portion (not shown) analogous to the arm portion 58 shown in FIG. 3. In the preferred embodiment, all of the components of the first layer 330 are formed as parts of a continuous piece of rigid material, and do not comprise discrete parts.

The torsion beam 334 connects the link portion 342 to the U-shaped slider portion 338. The link portion 342 forms one layer of the link portion 176, shown in FIGS. 9 and 10, and the slider portion 338 forms one layer of the slider portion 174, shown in FIGS. 9 and 10. The U-shaped slider portion 338 comprises a first support finger 343 positioned on one side of the torsion beam 334 and a second support finger 344 positioned on the other side of the torsion beam 334. The support fingers 343 and 344 are symmetrically positioned about a center line 346.

The torsion beam 334 comprises a beam symmetrically positioned about the longitudinal center line 346 that bisects the torsion beam 334 in the longitudinal direction. A right end 350 and a left end 354 of the torsion beam 334 are flared slightly where the torsion beam 334 merges with the link portion 342 and the slider portion 338, respectively. A parameter RR designates the radius of curvature of a flared section 355. A parameter RL designates the radius of curvature of a flared section 356. Generally, RR and RL range from 0.05 to 0.20 millimeters.

A parameter WR designates the width of the torsion beam 334 at the right end 350 and a parameter WL designates the width of the torsion beam 334 at the left end 354. The torsion beam 334 has a length L. The link portion 342 has a width "v" at the end where the torsion beam 334 meets the link portion 342.

As defined previously with respect to FIG. 12, pitch and roll are defined as rotation about the "y" and "x" axes shown in FIG. 19. Yaw is defined as rotation about the "z" axis. Vertical deflection is defined as movement in the direction of the "z" axis, in other words motion along line 450 as shown in FIG. 10.

Figure 20:
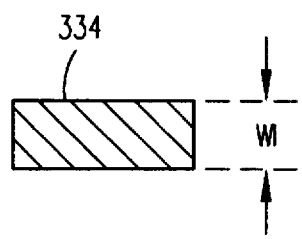
FIG. 20 is a cross-sectional view of the torsion beam taken along the line 20—20 of FIG. 19.
Figure 21:
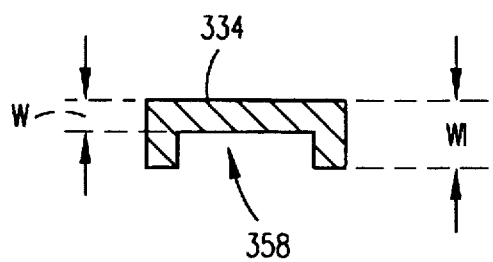
FIG. 21 is a cross-sectional view of an alternative embodiment of the torsion beam taken along the line 20—20 of FIG. 19.

FIG. 20 is a cross-sectional view taken along the line 20—20 of FIG. 19, illustrating that the torsion beam 334 has a thickness WI. FIG. 21 is cross-sectional view of an alternative embodiment of the torsion beam 334 in which a channel 358 is formed in the torsion beam 334. The channel 358 comprises a region in which a portion of the first layer 330 has been removed. In the region of the channel 358, the thickness W of the first layer 330 is less than the width WL. The channel 358 functions to reduce pitch and roll stiffness of the torsion beam 334. However, the channel 358 will also reduce vertical stiffness, thereby limiting the preload. Therefore, in some situations, the channel 358 will not be a desired feature.

Referring again to FIG. 19, the impact of the shape of the flexure 334 can be examined. By varying the parameters L, WL, WR, RL, RR and WI, the pitch, roll, yaw, load deflection and stress can be optimized so that the suspension 170 meets a particular need. The measurements of pitch, roll, yaw and load deflection are taken by standard measuring equipment well-known in the art. Predictions of the above can be understood through analytical modelling.

Using this technique, it can be determined that when the first layer 330 has the base configuration described below, the roll has the dependency described below. Base configuration: WL=WR=0.15 mm; L=0.8 mm; RR=RL=0.1 mm; and WI=0.0254 mm. Roll increases linearly with L;

decreases with RR; decreases exponentially with WI; and decreases exponentially with WR.

TABLE 1

| Parameter | Base | Optimized |
|---|---|---|
| Kroll (mN mm/Rd) | 71.2 | 96.5 |
| Kpitch (mN mm/Rd) | 46.5 | 45.4 |
| Kyaw (mN mm/Rd) | 1770 | 13470 |
| yaw freq. (kHz) | 5.34 | 14.8 |
| Kvert. (mN/mm) | 722 | 1320 |
| deflection (mm) | 0.0554 | 0.0303 |
| length (mm) | 0.8 | 0.5 |
| RL = RR (mm) | 0.1 | 0.11 |
| WL = WR (mm) | 0.15 | 0.29 |
| WI (mm) | 0.0254 | 0.018 |
| stress (ksi) | 127.2 | 103.7 |
| preload (gm) | 4 | 4 |

Figure 22:
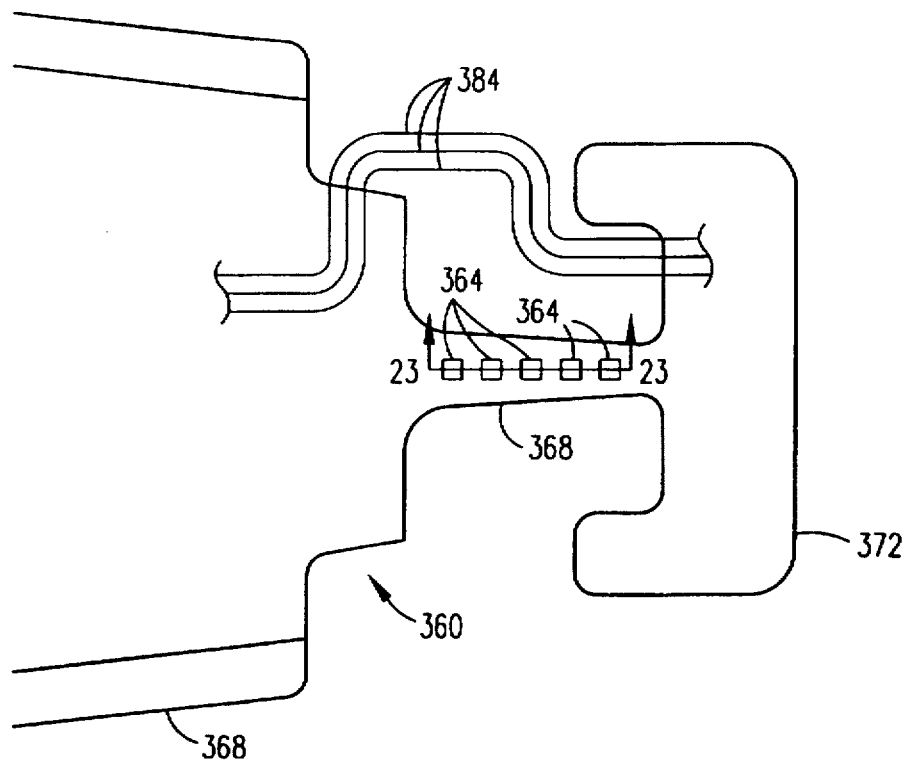
FIG. 22 is a top view of a slider suspension system having a plurality of damping structures positioned on the flexure according to the present invention.

FIG. 22 is top view of a suspension 360 having a plurality of damping structures 364 positioned on a flexure 368. The suspension 360 is analogous to the suspension 170 shown in FIG. 9 and includes a link portion 368 and a slider portion 372 analogous to the link portion 176 and a slider portion 174. The suspension 360 includes the first layer 330 shown in FIG. 19, as well as a second layer 376 and a third layer 380 shown in FIG. 23.

The flexure 368 is identical to the flexure 192 described with respect to FIG. 15 except that the damping structures 364 have replaced the electrical lines 184 in the third layer 380. A plurality of electrical connections 384 for connection to a read/write slider are routed to the slider portion 372 by a pathway that does not interfere with the damping structures 364. The electrical connections may be flex cable, or may be formed in the third layer 380 like the electrical lines 184, or may be any other suitable means for connecting a read/write slider to a disk file such as the disk file 84 shown in FIG. 5.

Figure 23:
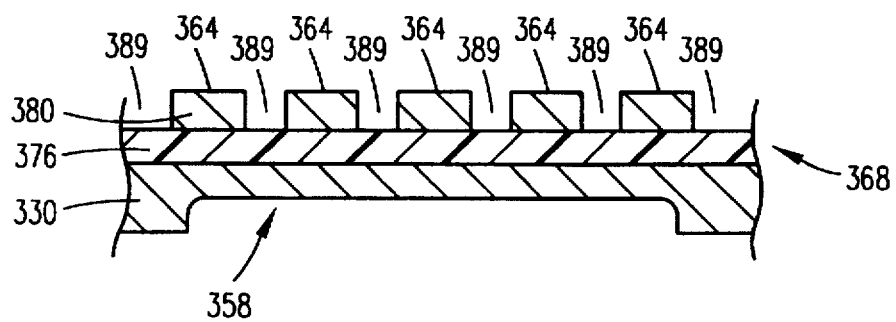
FIG. 23 is a cross-sectional view of the flexure taken along the line 23—23 of FIG. 22.

FIG. 23 illustrates that the flexure 368 is comprised of a three-layer laminate 388 which is identical the laminate 39 described with respect to FIG. 2. In the preferred embodiment, the damping structures 364 are approximately rectangular shaped regions etched in the third layer 380. The damping structures 364 are surrounded on all sides by a space 389 so that each damping structure 364 does not contact another part of the third layer 380. Other shapes could also be used for the damping structures 364. The channel 358 shown in FIG. 23 is an optional feature that could be deleted as was discussed previously with respect to FIG. 21.

The damping structures 364 function to dampen vibrations in the flexure 368 by providing regions in which the second layer 376 can undergo shear. When the flexure 368 undergoes bending vibrations, the material of the first layer 330 undergoes cyclic deformation. Since the second layer 376 is bonded to the first layer 330, this deformation is transmitted into the bottom surface of the material comprising the second layer 376.

In regions where the second layer 376 is covered by a damping structure 364, the top surface of the second layer 376 is constrained from deforming beyond what the stiffness of the damping structure 364 allows. Therefore, layer 376 is sheared across its thickness. Shear motion inside the layer 376 absorbs energy of the system thereby damping the modal motion of the flexure 368. The damping structures 364 are particularly useful for reducing the amplitude of the yaw vibrational mode.

Figure 24:
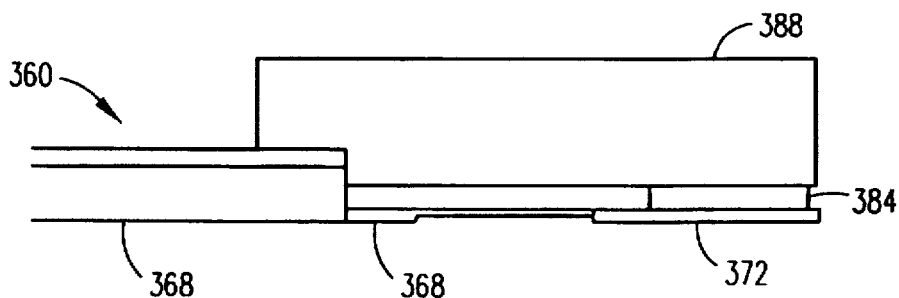
FIG. 24 is a side view of a slider suspension system having a shim positioned underneath the slider according to the present invention.

FIG. 24 illustrates the use of a shim 384 for creating a space between a slider 388 and the flexure 368. The shim 384 serves the same purpose as the solder bumps 196 described previously with respect to FIG. 10. The shim 384 could be a piece of sheet metal or some other material and could be replaced with the solder bumps 196. The purpose of the shim 384 is to create a space for the flexure 368 to deflect into to accommodate preload deflection and/or other deflections of the flexure 368, such as deflection caused by pitch and roll.

Figure 25:
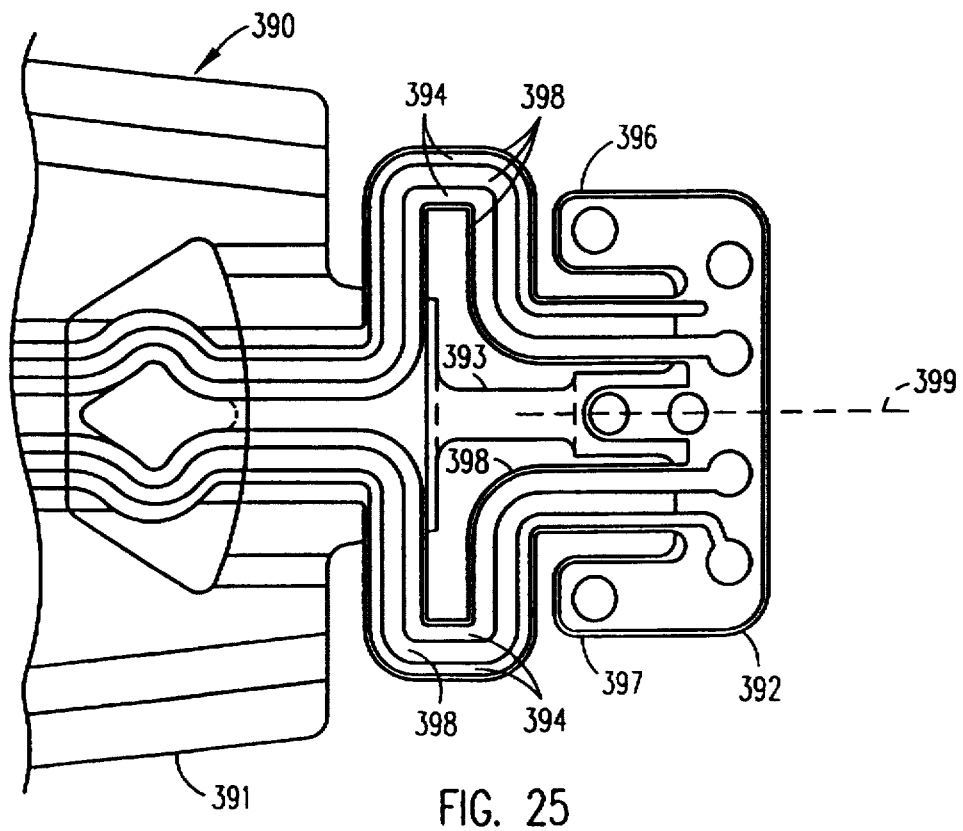
FIG. 25 is a top view of part of a slider suspension system in which the electrical lines are no positioned over the flexure.

FIG. 25 is top view of a suspension 390 which is analogous to the suspension 360 shown in FIG. 22. The suspension 390 includes a link portion 391 and a slider portion 392 analogous to the link portion 368 and the slider portion 372 described previously with respect to FIG. 22. In one embodiment, the link portion 391 and the slider portion 392 of the suspension 390 are comprised of the first layer 330, the second layer 376, and the third layer 380 (shown in FIG. 23). However, the suspension 390 includes a flexure 393 which is comprised of only the first layer 330 as is illustrated in FIG. 20 for the flexure 334.

The flexure 393 is comprised of the same materials as were previously described with respect to the first layer 40 of FIG. 2 and has the same design parameters as were described previously for the torsion beam 334 shown in FIG. 19. Additionally, the flexure 393 does not include any of the damping structures 364 shown in FIG. 22.

In the suspension 390, a plurality of electrical lines 394 for connection to a read/write slider are routed to the slider portion 392 by a serpentine pathway that does not pass over the flexure 393. The electrical lines 394 are preferably formed in the third layer 380 as was previously described with respect to the electrical lines 154 shown in FIG. 7. A plurality of spaces 398 are positioned on each side of each electrical line 394 as was previously described with respect to the spaces 158 shown in FIG. 7.

Preferably, the electrical lines 394 are supported only by an insulating layer such as the second layer 164 illustrated in FIG. 8. The purpose of routing the electrical lines 394 away from the flexure 393 is to minimize the effect of the second layer 376 and the third layer 380 on pitch and roll stiffness of the flexure 393.

The electrical lines 394 could also be comprised of at least one discrete wire, or a flex cable or other suitable means for connecting a read/write slider to a disk file such as the disk file 84 shown in FIG. 5. The term "discrete wire" means a wire that is added to the suspension and is not formed in one of the layers of the laminate, such as the third layer 380, that forms the link portion. The term "flex cable" means a separate conductor assembly fabricated from laminated materials, typically copper and a dielectric material such as a polyimide, and then added to the suspension. Fabrication techniques for preparing flex cables are varied, but typically utilize photolithography and chemical etching processes well-known in the chemical milling industry.

When the electrical lines 394 are not formed in the third layer 380, the suspension 390 can be comprised entirely of the first layer 360 as was described previously with respect to FIG. 19.

The slider portion 392 comprises a first support finger 396 positioned on one side of the flexure 393 and a second support finger 397 positioned on the other side of the flexure 393. The support fingers 396 and 397 are symmetrically positioned about a center line 399 which bisects the flexure 393.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A suspension for supporting a read/write slider comprising:
 a slider support member:
 a load beam comprising a first layer comprised of a metal, a second layer comprised of a dielectric material and positioned over the first layer, and a third layer comprised of a high strength electrically conductive material and positioned over the second layer, the load beam having a distal end with the first layer having a width "v" measured at the distal end; and
 a flexure that connects the load beam to the slider support member, the flexure comprising a single elongated beam comprised of a first flexure layer which is part of the first layer and which has a width "r" greater than zero, a second flexure layer which is part of the second layer and a third flexure layer which is part of the third layer, the third flexure layer having a width "s" which is greater than the width "r", the single elongated beam having less stiffness than the load beam, and the width "r" always being less than the width "v".

2. The suspension of claim 1 further comprising:
 a plurality of electrical lines positioned over the second flexure layer and formed in the third flexure layer.

3. The suspension of claim 1 wherein the third flexure layer has a thickness less than or equal to eighteen microns.

4. The suspension of claim 1 wherein the third flexure layer comprises a high strength electrically conductive material selected from the group consisting of Cu—Ni—Si—Mg alloy, Be—Cu—Ni , and Cu—Ti alloy.

5. The suspension of claim 1 wherein the first flexure layer comprises stainless steel.

6. The suspension of claim 1 wherein the second flexure layer comprises a dielectric material selected from the group consisting of a polyimide, an epoxy and a perfluoromethylene compound of the formula $F(CF_2)_nF$.

7. The suspension of claim 1 further comprising:
 a read/write slider attached to the slider support member;
 a spacer that creates a clearance between the flexure and the read/write slider; and
 a plurality of electrical lines formed in the third flexure layer and positioned in the clearance created by the spacer.

8. The suspension of claim 7 wherein the spacer comprises a plurality of solder balls positioned on the slider support member.

9. The suspension of claim 7 wherein the spacer comprises a fusible material positioned on the slider support member.

10. The suspension of claim 7 further comprising:
 a data transducer positioned on the read/write slider and wherein electrical contact is made between at least one of the electrical lines and the data transducer by at least one right angle fillet joint.

11. The suspension of claim 1 further comprising:
 a plurality of electrical lines formed in the third layer and positioned above the first layer of the load beam for making electrical contact with a data transducer; and
 a plurality of apertures extending through the first layer of the load beam for reducing the capacitance of the electrical lines.

12. The suspension of claim 1 further comprising:
 a plurality of damping structures formed in the third flexure layer and positioned on the flexure.

13. The suspension of claim 12 wherein each damping structure comprises a region of the third flexure layer completely surrounded by an open space.

14. The suspension of claim 1 further comprising:
 a channel formed in the first flexure layer so that the thickness of the first flexure layer is not uniform over the length of the elongated beam.

15. A suspension system comprising:
 a data transducer for reading and/or writing data on a data storage medium;
 a slider for holding the data transducer;
 a slider support member for holding said slider;
 a load beam comprising a first layer comprised of a rigid material, a second layer comprised of a dielectric material and positioned over the first layer, and a third layer positioned over the second layer and comprised of a high strength electrically conductive material selected from the group consisting of Cu—Ni—Si—Mg alloy, Be—Cu—Ni alloy and Cu—Ti alloy;
 a flexure that connects the load beam to the slider support member, the flexure comprising an elongated beam aligned with the center of the slider and having less stiffness than the load beam;
 a plurality of electrical lines for making electrical connection to the data transducer, the electrical lines being formed in the third layer of the load beam; and
 a serpentine section comprised of a section of the electrical lines that extends from the load beam to the slider support member without overlapping the flexure and which is comprised of the third layer and the second layer but not the first layer.

16. The suspension system of claim 15 wherein the slider support member comprises a first support finger positioned on one side of the flexure and a second support finger positioned on a second side of the flexure.

17. The suspension system of claim 15 wherein the elongated beam comprises a torsion beam having a length L, a first width WL at a first end of the torsion beam and a second width WR at a second end of the torsion beam, and wherein the elongated beam is comprised of a rigid material.

18. The suspension system of claim 17 wherein the first width WL is equal to the second width WR.

19. The suspension system of claim 17 wherein the first width WL is in the range of 0.15 to 0.29 mm.

20. The suspension system of claim 17 wherein the length L is in the range of 0.5 to 0.8 mm.

21. The suspension system of claim 17 further comprising:
 a first flared section positioned at the first end of the torsion beam where the torsion beam is connected to the load beam, the first flared section having a first radius of curvature RL; and
 a second flared section positioned at the second end of the torsion beam where the torsion beam is connected to the slider support member, the second flared section having a second radius of curvature RR.

22. The suspension system of claim 21 wherein the first radius of curvature RL is equal to the second radius of curvature RR.

23. The suspension system of claim 21 wherein the first radius of curvature RL is in the range of 0.05 to 0.20 mm.

24. The suspension system of claim 15 wherein the flexure comprises stainless steel.

25. A suspension system comprising:

a data transducer for reading and/or writing data on a data storage medium;

a slider for holding the data transducer;

a slider support member for holding the slider;

a load beam comprising a first layer comprised of a metal, a second layer comprised of a dielectric material and positioned over the first layer, and a third layer comprised of a high strength electrically conductive material selected from the group consisting of Cu—Ni—Si—Mg alloy, Be—Cu—Ni alloy and Cu—Ti alloy, the third layer being positioned over the second layer;

a flexure that connects the load beam to the slider support member, the flexure comprising a single elongated beam comprised of a first flexure layer which has a width "r" and which is part of the first layer, a second flexure layer which is part of the second layer and a third flexure layer which has a width "s" which is greater than the width "r" and which is part of the third layer, the elongated beam having less stiffness than the load beam; and a plurality of electrical lines positioned over the second flexure layer and formed in the third flexure layer.

* * * * *